United States Patent
Davis

(10) Patent No.: US 9,859,138 B2
(45) Date of Patent: Jan. 2, 2018

(54) INTEGRATED SUBSTRATE DEFECT DETECTION USING PRECISION COATING

(71) Applicant: Lam Research Corporation, Fremont, CA (US)

(72) Inventor: Matthew Davis, Felton, CA (US)

(73) Assignee: Lam Research Corporation, Fremont, CA (US)

( * ) Notice: Subject to any disclaimer, the term of this patent is extended or adjusted under 35 U.S.C. 154(b) by 42 days.

(21) Appl. No.: 14/518,886

(22) Filed: Oct. 20, 2014

(65) Prior Publication Data

US 2016/0111307 A1   Apr. 21, 2016

(51) Int. Cl.
| | | |
|---|---|---|
| H01L 21/67 | (2006.01) | |
| C23C 16/52 | (2006.01) | |
| H01L 21/66 | (2006.01) | |
| H01J 37/32 | (2006.01) | |
| C23C 16/44 | (2006.01) | |

(52) U.S. Cl.
CPC .... *H01L 21/67288* (2013.01); *C23C 16/4401* (2013.01); *C23C 16/52* (2013.01); *H01J 37/3299* (2013.01); *H01J 37/32853* (2013.01); *H01J 37/32889* (2013.01);
(Continued)

(58) Field of Classification Search
CPC . H01L 21/67288; H01L 22/12; H01L 21/311; H01J 37/321; H01J 37/32733; H01J 2237/3341; C23C 16/52; G01N 23/223; G01N 23/225; G01N 23/2251; G01N 23/2252; G01N 23/2254; G01N 23/2255;
(Continued)

(56) References Cited

U.S. PATENT DOCUMENTS

| | | | | | |
|---|---|---|---|---|---|
| 5,715,052 | A | * | 2/1998 | Fujino | G01N 21/94 250/559.41 |
| 6,130,419 | A | * | 10/2000 | Neal | G01J 9/00 250/201.9 |

(Continued)

OTHER PUBLICATIONS

Tamura et al., *Enabling 18 nm-size particle detection on Si surfaces by conventional laser scattering*, International Symposium on Semiconductor Manufacturing (Oct. 2010).

(Continued)

*Primary Examiner* — Michael Jung
*Assistant Examiner* — Mikka Liu
(74) *Attorney, Agent, or Firm* — Weaver Austin Villeneuve & Sampson LLP

(57) ABSTRACT

Apparatuses and methods for improved substrate defect detection is provided. Substrate defects may be detected, possibly with defect detection equipment such as laser metrology equipment. Defects smaller than the detection limit of the detection equipment may be decorated with a layer of material to increase the effective sizes of the defects. The thickness and composition of the material deposited may be tuned depending on the composition of the substrate and the defects. The composition of the detected defects may be identified with defect identification equipment. The defect identification equipment may be an electron generating apparatus and the composition of the defects may be identified from the interaction of the electrons with the defect. The deposited material may be removed either before or during the defect identification phase to aid in the identification of the defect composition.

12 Claims, 11 Drawing Sheets

(52) U.S. Cl.
CPC ........ *H01J 37/32935* (2013.01); *H01L 22/12* (2013.01); *H01L 22/24* (2013.01)

(58) Field of Classification Search
CPC ........... G01N 23/2257; G01N 23/2258; G01N 23/227; G01N 23/2273; G01N 23/2276
See application file for complete search history.

(56) References Cited

U.S. PATENT DOCUMENTS

| | | | | |
|---|---|---|---|---|
| 2008/0264905 | A1* | 10/2008 | Nasser-Ghodsi | G01N 1/32 216/84 |
| 2012/0088369 | A1* | 4/2012 | Weidman | G03F 7/0752 438/703 |
| 2013/0035245 | A1 | 2/2013 | Vreuls et al. | |
| 2014/0199784 | A1* | 7/2014 | Yang | H01L 21/67288 438/4 |
| 2015/0146193 | A1* | 5/2015 | Buczkowski | G01N 21/6489 356/72 |
| 2016/0293502 | A1 | 10/2016 | Pirkle | |

OTHER PUBLICATIONS

Pandit et al., *Effect of Thin Tantalum Film Decoration on Particle Size*, Future Fab International, Issue 35 (2010).

U.S. Appl. No. 15/083,039, filed Mar. 28, 2016, entitled "Method and Apparatus for Detecting Defects on Wafers."

Vreuls, et al., "Inorganic-binding peptides as tools for surface quality control," Article, Journal of Inorganic Biochemistry 104 (2010), pp. 1013-1021.

Berninger, Markus, "Max Planck Innovation awards license for actin marker LifeAct," Press Release, Max-Planck-Gesellschaft, Published Jul. 26, 2010, [Downloaded on Mar. 28, 2016 from https://www.mpg.de/622089/pressRelease20100722], 3pp.

"Rabbit Anti-Fluorogold Polyclonal Antibody," EMD Millipore Corporation, Data Sheet, Created Oct. 14, 2009, [Downloaded on Mar. 28, 2016 from http://www.emdmillipore.com/US/en/product/Anti-Fluorescent-Gold-Antibody, MM_NF-AB153], 2pp.

* cited by examiner

INTEGRATED SUBSTRATE DEFECT DETECTION USING PRECISION COATING

BACKGROUND

Substrate or semiconductor wafer quality improve with the absence of defects. Defects are reduced through improvements in the substrate or semiconductor wafer manufacturing process. As substrate manufacturing improves, eliminating the presence of smaller defects, that previously had minimal effects on substrate quality, become important to improving substrate quality. The smaller defects may be of a size that is undetectable through conventional defect detection techniques.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In certain implementations, a method may be provided. The method may include: (a) depositing a layer of material onto a particle bearing substrate, (b) detecting, with metrology equipment, a location of a particle on the substrate, and (c) identifying, a composition of the particle.

In some such implementations of the method, the layer of material may be deposited on at least a portion of the particle. In some such implementations, the method may further include: (d) removing, after (b) and before (c), at least a portion of the material deposited on the particle. In some such implementations, the removal of at least a portion of the material in (d) may be removed via Atomic Layer Etching (ALE), reactive ion etching, or ion milling. In some further or additional such implementations of the method, (c) may include identifying the composition of the particle via X-Rays from electrons interacting with the particle. In some further or additional such implementations of the method, the method may further include: (d) removing, after (b) and before (c), at least a portion of the material deposited on the particle, wherein (c) comprises identifying the composition of the particle via Auger electrons generated by electrons interacting with the particle.

In some further or additional implementations of the method, the layer of material may be deposited around the particle.

In some further or additional implementations of the method, the method may further include determining a thickness of the layer of material to deposit, wherein the thickness is calculated to maximize the probability of detecting the particle with the metrology equipment. In some such implementations, the thickness may be calculated by determining a thickness sweet spot that maximizes the probability of detecting the particle.

In some further or additional implementations of the method, the composition of one or more of the layer of material or the substrate may be selected to optimize the probability of detecting the particle with the metrology equipment in (b).

In some further or additional implementations of the method, the composition of one or more of the layer of material or the substrate may be selected to optimize the probability of identifying the composition of the particle in (c).

In some further or additional implementations of the method, the particle may be a size that is undetectable with the metrology equipment without the deposition of the material.

In some further or additional implementations of the method, the deposition in (a) may be performed via Atomic Layer Deposition (ALD).

In some further or additional implementations of the method, the method may be performed at an ambient temperature of 200 degrees Celsius or less.

In some implementations, an apparatus may be provided. The apparatus may include: a processing chamber with at least a first process station configured to receive a particle bearing substrate, deposition equipment configured to deposit material onto the substrate, metrology equipment configured to detect the location of a particle on the substrate, and one or more controllers for operating the processing chamber, the deposition equipment, the metrology equipment. The one or more controllers may include instructions for: (a) depositing, with the deposition equipment, a layer of material onto the first substrate at the first process station, (b) detecting, with the metrology equipment, a location of the particle on the substrate. In some such implementations, the apparatus may further include electron generating equipment configured to generate electrons directed at the substrate, identification equipment configured to identify the composition of the particle, and the one or more controllers may further include instructions for: (c) generating, with the electron generating equipment, electrons directed at the substrate at the location, (d) detecting, with the identification equipment, an interaction of the particle with the electrons, and (e) identifying, from the interaction, a composition of the particle.

In some such implementations of the apparatus, the apparatus may further include a second process station configured to receive the substrate such that the one or more controllers may further include instructions for transferring, after (a) and before (e), the substrate from the first process station to the second process station.

In some further or additional implementations of the apparatus, the layer of material may be deposited on at least a portion of the particle. In some such implementations, the one or more controllers may further include instructions for removing, after (b) and before (c), at least a portion of the material deposited on the particle. In some such implementations, the deposition equipment may be further configured to remove material from the substrate and the removal of at least a portion of the material may be removed via Atomic Layer Etching (ALE) performed by the deposition equipment. In some further or additional such implementations, (e) may further include identifying the composition of the particle via Auger electrons generated by electrons from the electron generating equipment interacting with the particle.

In some further or additional implementations of the apparatus, (e) may include identifying the composition of the particle via X-Rays from electrons generated from the electron generating equipment interacting with the particle.

In some further or additional implementations of the apparatus, the layer of material may be deposited around the particle.

In some further or additional implementations of the apparatus, the deposition equipment may be configured to perform Atomic Layer Deposition (ALD).

In some further or additional implementations of the apparatus, the particle may be a size that is undetectable with the metrology equipment without the deposition of the material.

DETAILED DESCRIPTION

Figure 1A:
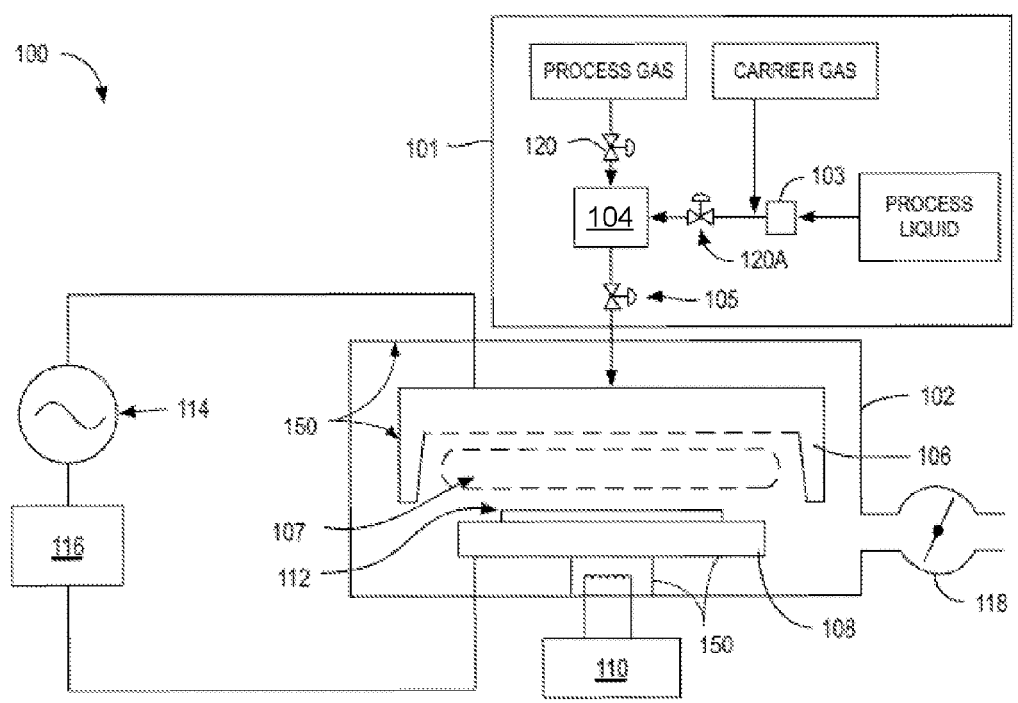
FIG. 1A shows a schematic representation of an example substrate processing apparatus.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

A factor in substrate or semiconductor wafer quality is the absence of defects. Defects are reduced through improvements in substrate processing. As substrate manufacturing improves, eliminating the presence of smaller defects, that previously had minimal effects on substrate quality, become important to improving substrate quality.

Defects on substrates may originate from multiple sources. For example, defects may result from the many components in a typical substrate processing chamber. A substrate processing chamber may have components such as showerheads, chamber walls, and windows. The materials of the showerheads, chamber walls, and the windows, or materials accumulating on chamber components in prior operations, may each be "shed," in the form of particles, onto a substrate, causing defects. It has been recognized that identifying the composition of the defect may also be useful to trace back the defects to their source, thus allowing for further improvements in reducing the defect count of substrates.

Substrate defects are detected with tools that may have detection thresholds that are determined by a number of design factors. Detection thresholds may include minimum size thresholds, where a defect below the minimum size threshold may not be detected. The minimum size threshold may vary for defects and/or substrates of different compositions.

An example tool may be a laser metrology tool. A laser metrology tool uses a probe laser that projects a beam onto a substrate. The beam reflects off the substrate and the reflections are analyzed to determine if a defect exists in the region of the substrate that the beam was projected onto. In order to detect defects of smaller sizes, the laser power, called fluence, is increased. As fluence is increased, the possibility of substrates or defects being damaged, or ablated, by the more powerful laser beam also increases.

A potential solution to detecting defects smaller than the minimum size threshold is decoration of the defects. For decoration, a layer or multiple layers of material is deposited onto the substrate. The material may encase the defect and thus, effectively increase the size of the defect, possibly to a size above the minimum size threshold of the defect detection equipment. The defect may then be detectable by the laser metrology tool without an increase in laser fluence.

Additionally, in certain implementations, defect decoration may be combined with defect detection and defect identification to allow defects that were previously below the minimum size threshold to be detected and identified. Identifying the defect may include determining the composition of the defect, such as its material composition. Defect decoration, detection, and identification may be split into their own separate phases.

In certain implementations, defect detection equipment may scan the entire area of a substrate, identify the coordinate positions of each defect, and then identify the defects at the coordinate positions after the substrate has been scanned. In other implementations, the identity of a defect may be determined once a defect location has been identified.

FIG. 1A shows a schematic representation of an example substrate processing apparatus. The substrate processing apparatus shown in FIG. 1A may be used to decorate defects.

For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein in FIG. 2. Further, it will be appreciated that, in some implementations, one or more hardware parameters of processing apparatus 100, including those discussed in detail above, may be adjusted programmatically by one or more system controllers.

In some implementations, a controller may be a part of a system, which may be part of the examples described herein. Such systems may comprise semiconductor processing equipment, including a processing tool or tools, chamber or chambers, a platform or platforms for processing, defect detection equipment, defect identification equipment and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, laser power fluence, lens configuration, electron generating equipment settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Referring back to FIG. 1A, process station 100 fluidly communicates with reactant delivery system 101 for delivering process gases to a distribution showerhead 106. Reactant delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The implementation of FIG. 1A includes a vaporization point 103 for vaporizing liquid reactant to be supplied to mixing vessel 104. In some implementations, vaporization point 103 may be a heated liquid injection module. In some additional implementations, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may contaminate substrates.

In some implementations, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1A, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some implementations, a microvolume 107 is located beneath showerhead 106. Performing a deposition process, such as an ALD process, in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some implementations, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some implementations, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. It will be appreciated that, in some implementations, pedestal height may be adjusted programmatically by a suitable system controller.

While the example microvolume variations described herein refer to a height-adjustable pedestal, it will be appreciated that, in some implementations, a position of showerhead 106 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some implementations, pedestal 108 may include a rotational axis for rotating an orientation of substrate 112. It will be appreciated that, in some implementations, one or more of these example adjustments may be performed programmatically by one or more suitable system controllers having machine-readable instructions for performing all or a subset of the foregoing operations.

Additionally, in FIG. 1A, showerhead 106 and pedestal 108 electrically communicate with RF power supply 114 and matching network 116 for powering a plasma. In some implementations, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Likewise, RF power supply 114 may provide RF power of any suitable frequency. In some implementations, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some implementations, pedestal 108 may be temperature controlled via heater 110. Further, in some implementations, pressure control for processing apparatus 100 may be provided by one or more valve-operated vacuum sources such as butterfly valve 118. As shown in the implementation of FIG. 1, butterfly valve 118 throttles a vacuum provided by a downstream vacuum pump (not shown). However, in some implementations, pressure control of processing apparatus 100 may also be adjusted by varying a flow rate of one or more gases introduced to processing chamber 102. In some implementations, the one or more valve-operated vacuum sources—such as butterfly valve 118—may be used for removing film precursor from the volumes surrounding the process stations during the appropriate ALD operational phases.

The processing apparatus 100 may be coupled to facilities (not shown) when installed in a clean room or a fabrication facility. Facilities may include plumbing that provide processing gases, vacuum, temperature control, and environmental particle control. In certain implementations, the techniques and processes detailed herein may be performed at ambient temperatures of less than 50 degrees Celsius, less than 100 degrees Celsius, less than 200 degrees Celsius, or at any temperature suited for processing substrates, detecting defects, or identifying defects. These facilities may be coupled to the processing apparatus 100, when installed in the fabrication facility. Additionally, the processing apparatus 100 may be coupled to a transfer chamber that allows robotics to transfer semiconductor wafers into and out of the processing apparatus 100 using typical automation.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, laser metrology device, electron generating equipment, and any other semiconductor processing systems that may be associated or used in substrate defect detection or identification.

In some implementations, there may be a user interface associated with the system controller. The user interface may include a display screen, graphical software displays of the apparatus and/or process conditions, and user input devices such as pointing devices, keyboards, touch screens, microphones, etc.

Figure 1B:
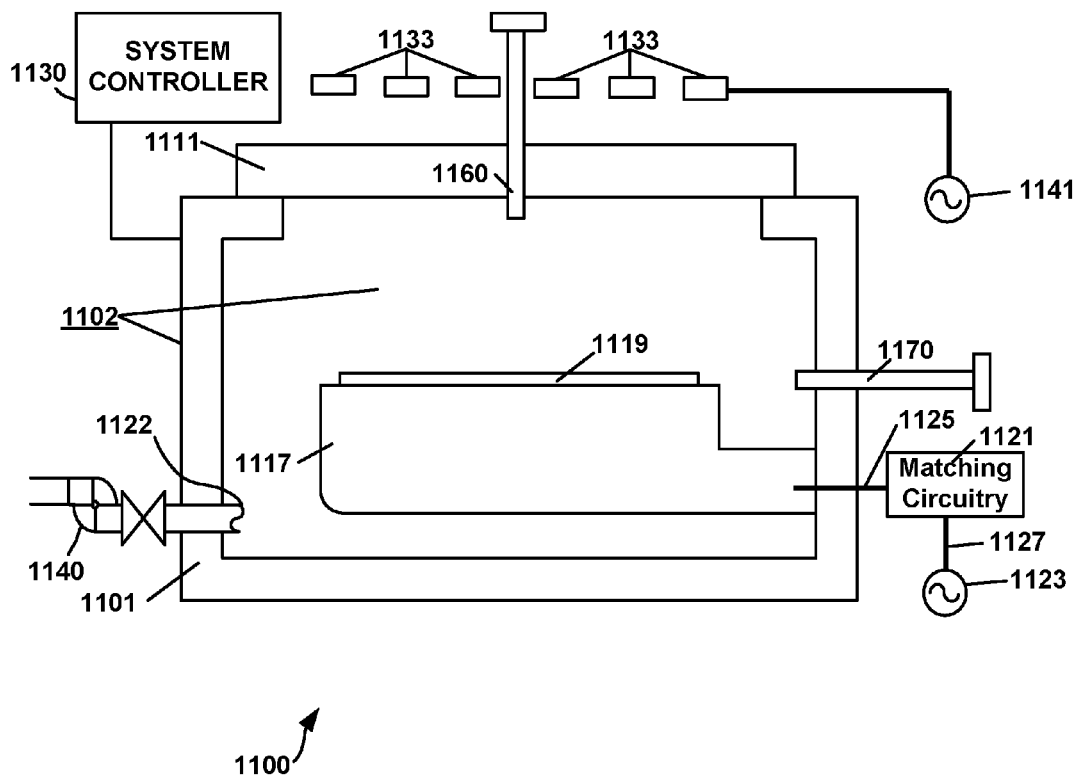
FIG. 1B shows a schematic representation of an example substrate etch apparatus.

FIG. 1B shows a schematic representation of an example substrate etch apparatus. The apparatus in FIG. 1B may be used to perform etching operations on substrate to, for example, remove deposited material.

The example substrate etching apparatus 1100 includes a chamber defined by chamber walls 1101 and a window 1111. The chamber walls 1101 may be fabricated from, for example, stainless steel or aluminum. The window 1111 may be fabricated from, for example, quartz or other dielectric material. A chuck 1117 may be configured to receive and hold a semiconductor wafer 1119. The chuck 1117 may be an electrostatic chuck for supporting the wafer 1119 when present. The chuck 1117 may be electrically charged using an RF power supply 1123. The RF power supply 1123 may be connected to matching circuitry 1121 through a connection 1127. The matching circuitry 1121 may be connected to the chuck 1117 through a connection 1125. In this manner, the RF power supply 1123 may be connected to the chuck 1117.

A coil 1133 is positioned above window 1111. An RF power supply 1141 is configured to supply RF power to the coil 1133. Process gases may be supplied through a main injection port 1160 positioned in the upper chamber and/or through a side injection port 1170, sometimes referred to as an STG. A vacuum pump, e.g., a one or two stage mechanical dry pump and/or turbomolecular pump 1140, may be used to draw process gases out of the process chamber 1102 and to maintain a pressure within the process chamber 1102 by using a closed-loop-controlled flow restriction device, such as a throttle valve (not shown) or a pendulum valve (not shown).

During operation of the apparatus, one or more reactant gases may be supplied through injection ports 1160 and/or 1170. In certain embodiments, gas may be supplied only through the main injection port 1160, or only through the side injection port 1170. In some cases, the injection ports may be replaced by showerheads.

Radio frequency power may be supplied from the RF power supply 1141 to the coil 1133 to cause an RF current to flow through the coil 1133. The RF current flowing through the coil 1133 generates an electromagnetic field about the coil 1133. The electromagnetic field may generate an inductive current within the chamber 1102. The physical and chemical interactions of various generated ions and radicals with the wafer 1119 may etch features on the wafer.

Figure 2:
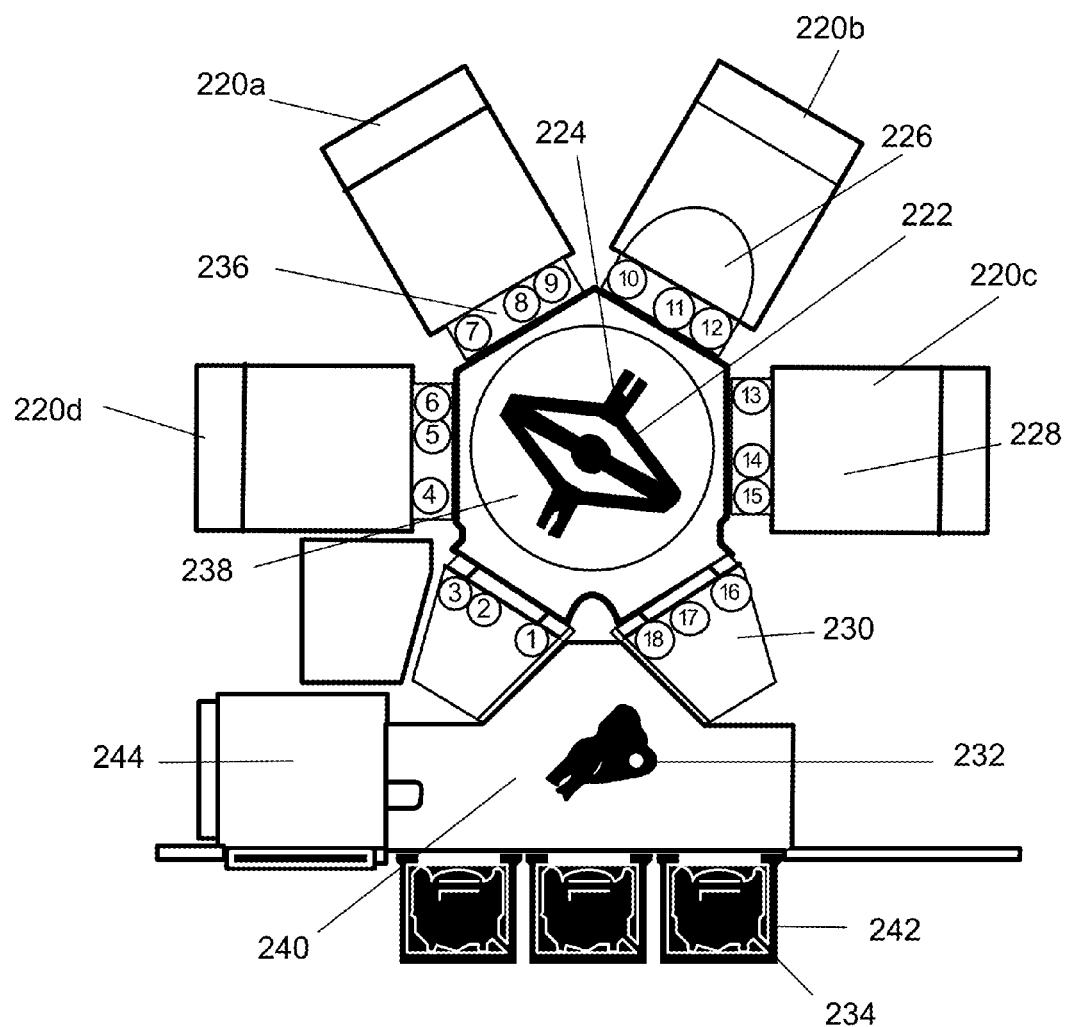
FIG. 2 shows a schematic representation of an example cluster tool implementation of a substrate defect detection apparatus.

The single process station apparatus of FIG. 1A or 1B may be adapted to be a multi process station apparatus. FIG. 2 shows a schematic representation of an example cluster tool implementation of a substrate defect detection apparatus.

FIG. 2 depicts a semiconductor process cluster architecture with various modules that interface with a vacuum transfer module 238 (VTM). The arrangement of transfer modules to "transfer" substrates among multiple storage facilities and processing modules may be referred to as a "cluster tool architecture" system. Airlock 230, also known as a loadlock or transfer module, is shown in VTM 238 with four processing modules 220a-220d, which may be individual optimized to perform various fabrication processes. By way of example, processing modules 220a-220d may be implemented to perform substrate etching, deposition, ion implantation, substrate cleaning, sputtering, and/or other semiconductor processes as well as laser metrology and other defect detection and defect identification methods. One or more of the processing modules (any of 220a-220d) may be implemented as disclosed herein, i.e., for depositing films, etching substrates, detecting defects, identifying defects, and other suitable functions in accordance with the disclosed embodiments. Airlock 230 and process module 220 may be referred to as "stations." Each station has a facet 236 that interfaces the station to VTM 238. Inside each facet, sensors 1-18 are used to detect the passing of substrate 226 when moved between respective stations.

Robot 222 transfers substrates between stations. In one implementation, the robot may have one arm, and in another implementation, the robot may have two arms, where each arm has an end effector 224 to pick substrates for transport. Front-end robot 232, in atmospheric transfer module (ATM) 240, may be used to transfer substrates from cassette or Front Opening Unified Pod (FOUP) 234 in Load Port Module (LPM) 242 to airlock 230. Module center 228 inside process module 220 may be one location for placing the substrate. Aligner 244 in ATM 240 may be used to align substrates.

In an exemplary processing method, a substrate is placed in one of the FOUPs 234 in the LPM 242. Front-end robot 232 transfers the substrate from the FOUP 234 to an aligner 244, which allows the substrate 226 to be properly centered before it is processed, etched or detected for defects, or identified of defects. After being aligned, the substrate is moved by the front-end robot 232 into an airlock 230. Because airlock modules have the ability to match the environment between an ATM and a VTM, the substrate is able to move between the two pressure environments without being damaged. From the airlock module 230, the substrate is moved by robot 222 through VTM 238 and into one of the process modules 220a-220d. In order to achieve this substrate movement, the robot 222 uses end effectors 224 on each of its arms.

It should be noted that the computer controlling the substrate movement can be local to the cluster architecture, or can be located external to the cluster architecture in the manufacturing floor, or in a remote location and connected to the cluster architecture via a network.

Figure 3:
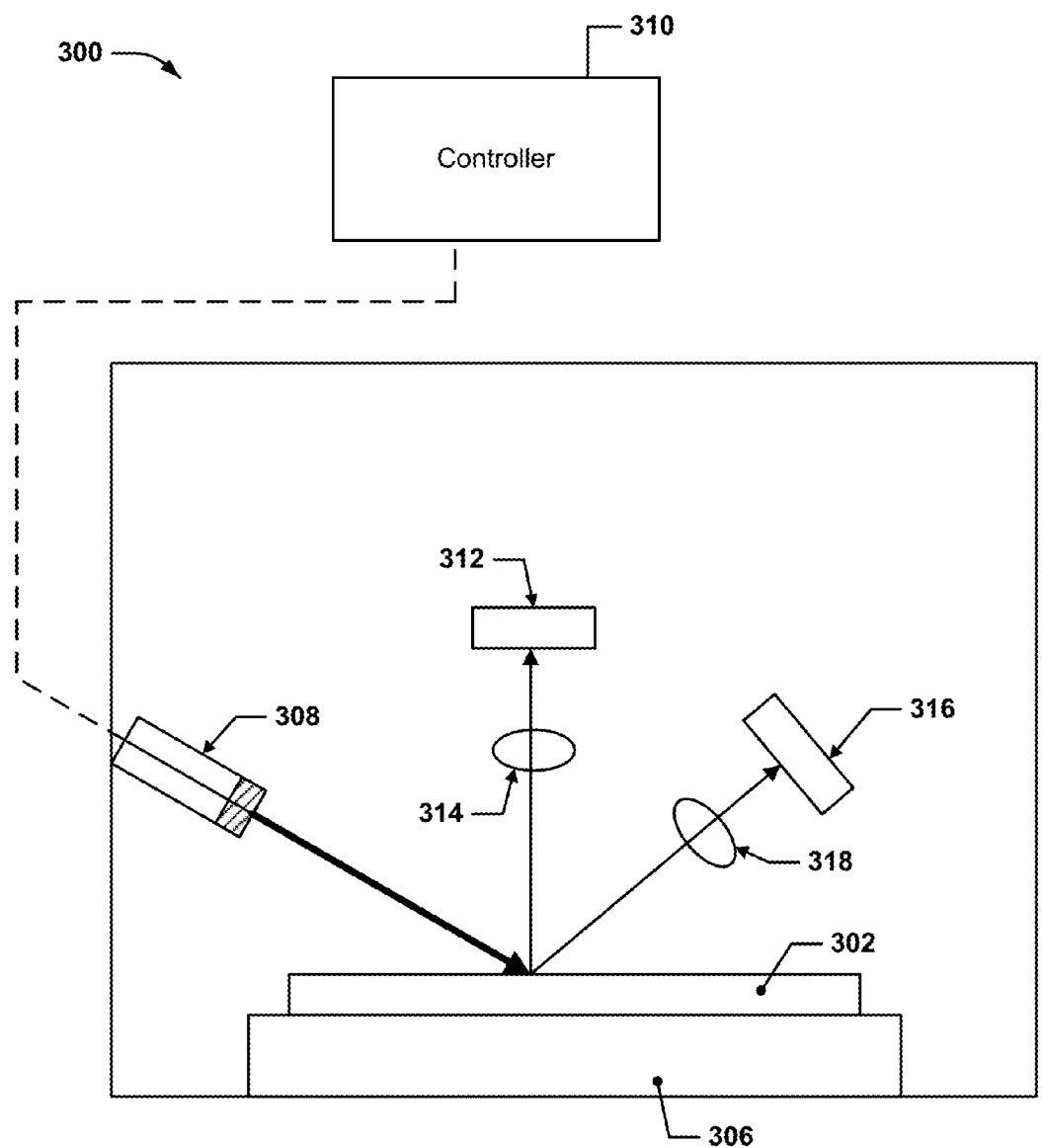
FIG. 3 shows a schematic representation of example defect detection equipment.

FIG. 3 shows a schematic representation of example defect detection equipment. The example substrate defect detection equipment 300 of FIG. 3 may be, for example, laser metrology equipment. The equipment of FIG. 3 may be located in a FOUP of a multi-station substrate defect detection apparatus or may be located in a single station substrate defect detection apparatus. In certain implementations of a single station substrate defect detection apparatus, the substrate defect detection equipment 300 may be housed with other equipment to allow for defect detection as well as other processes to be performed in a single location. In other implementations of a single station substrate defect detection apparatus, only defect detection may be carried out at the station. In such implementations, other processes may be performed at other stations or apparatuses.

Substrate defect detection equipment 300 includes a substrate holder 306 supporting a substrate 302, a laser light source 308, lenses 314 and 318, light detectors 312 and 316, and controller 310. The substrate defect detection equipment 300 may detect the defects of processed substrates. The substrate defect detection equipment 300 may include detectors with various placements intended to detect obliquely scattered, forward scattered, reverse scattered, normal incidence scattered light, etc. The signals from the detectors may be combined in various ways to maximize detection probability on a variety of substrates offering a variety of background scattering. In certain implementations, the substrate defect detection equipment may generate "noise" that needs to be canceled out. Noise may be canceled out via algorithms in control software, or through other techniques. A laser darkfield inspection system is an example of such a substrate defect detection equipment.

The substrate holder 306 may be a substrate holder such as the chuck described in FIG. 1A. The substrate holder 306 may be configured to hold the substrate 302 in a certain orientation. The substrate 302 may be a substrate that has previously undergone processing operations. The substrate 302 may be a substrate processed during normal production, or it may be a substrate specifically made for analyzing defects in order to improve the processing of substrates and lead to processes with lower defect counts. If a substrate is specifically made for analyzing defects, it may differ from production substrates in that the substrate's composition may be tailored to aid in defect detection and identification.

The light source 308 may be a source of light such as a laser. The light source 308 may be aimed to direct a light, such as a laser beam, at the substrate 306. In certain implementations, the light may be directed through one or more polarizing elements (not shown) to alter the light before the light hits the substrate 306. The light may be directed at the substrate 306 at an oblique angle of incidence. The angle of incidence may be calculated such that at least a portion of the light directed at the substrate 306 reflects off the surface of the substrate 306. The substrate 306 may scatter the light directed at the substrate.

The light reflected or scattered off of substrate 306 may be collected by lenses and light detectors. Different implementations of the substrate defect detection equipment 300 may have different quantities of lenses and light detectors. In the implementation shown in FIG. 3, there are two lenses, lenses 314 and 318, and two light detectors, light detectors 312 and 316. The lenses 314 and 318 may collect, focus, and/or polarize light scattered off the surface of the substrate 302. In certain implementations, the lenses may be concave lenses, convex lenses, cylindrical lenses, or refractive lenses. The lenses may be an individual lens or a collection of lenses.

After the light is collected, focused, and/or polarized by the lenses 314 and 318, it may be detected by the light detectors 312 and 316, respectively. Data of the light detected by the light detectors may be used to determine whether any defects are present in the area of the substrate illuminated by the light source 308.

In such an implementation, light that is scattered at a more acute angle to that of the substrate 302 may be collected, focused, and/or polarized by lens 318 to be collected by the light detector 316. Light that is scattered at closer to normal to the substrate 302 may be collected, focused, and/or polarized by lens 314 to be collected by the light detector 312.

The defect detection equipment 300 in FIG. 3 is an example defect detection equipment. Other configurations of defect detection equipment may also be used in the methods, apparatuses, and processes disclosed herein. For example, laser metrology equipment which has configurations that are different in the quantity and function of the lenses, types of polarizing equipment, style of optical equipment, types of light detection equipment, and styles of lasers or other light emitting equipment, may be used. Additionally, equipment other than laser metrology equipment, such as electron imaging (SEM) equipment, non-laser darkfield inspection equipment, non-laser brightfield inspection equipment, and other equipment could be used to identify defects in the methods, apparatuses, and processes disclosed herein.

Figure 4:
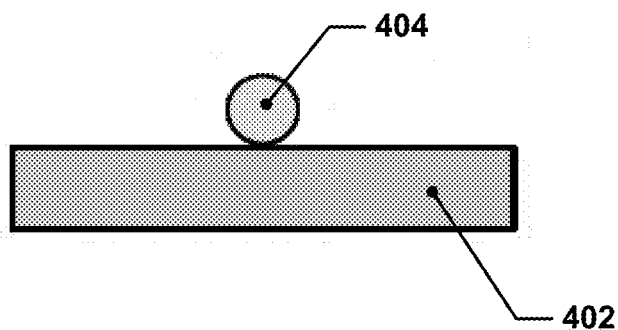
FIG. 4 illustrates an example defect decoration procedure that may aid in defect detection.
Figure 4:
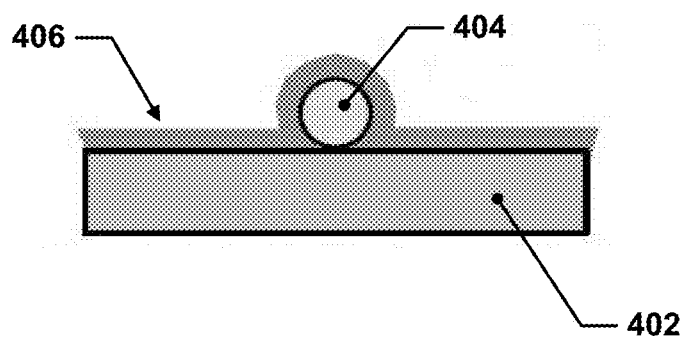

FIG. 4 illustrates an example defect decoration procedure that may aid in defect detection. The example coating procedure in FIG. 4 may be a procedure to decorate defects on a substrate and may be performed by, for example, an ALD apparatus. The procedure shown in FIG. 4 may be a phase of the defect detection procedure before laser metrology is performed.

In step 400A, a defect 404 is present on a substrate 402. The defect particle 404 may be a particle from, for example, a chamber wall, a window in the chamber, tools used in substrate process, or contamination from other sources. The defect particle 404 may be a size that is currently undetectable through conventional laser metrology techniques when the laser is used at fluence levels that are not damaging to the substrate.

In 400B, a decoration layer 406 has been deposited onto the substrate 402 and the defect particle 404. The decoration layer 406 may be a layer deposited through a semiconductor deposition operation, such as ALD, CVD, PECVD, or PVD. In certain implementations, ALD may offer advantages in one or more of: conformality, precision of thickness control, and the ability to control the wetting of defects and substrates. The material of decoration layer 406 may be any material compatible with the deposition process and appropriate for the decoration of defect particles. As a non-limiting example, $SiO_2$, $Si_3N_4$, TiN, $TiO_2$, AC (amorphous carbon), $Al_2O_3$, or other materials may be used in such deposition processes. As shown in step 400B, the decoration layer 406 increases the effective diameter of the size of the defect. Decoration of the defect particle 404 may increase the size of the defect, which may previously have been a size below the minimum detection threshold of defect detection equipment, to a size above that of the minimum detection threshold of the defect detection equipment. Accordingly, decoration of the defect may allow a defect of a previously undetectable size to be increased to a size that can then be detected.

In certain implementations, the material of the decoration layer may be selected to aid in the detection of particles. It has been recognized that, one method to detect the composition of the defects is to compare the energy of X-Ray particles generated by the various materials such as the substrate, the defect, and the decoration layer. If materials are appropriately selected such that the energy of the X-Ray particles generated by substrate, defect, and decoration layer are different, detection of the defects may be aided.

For example, if the substrate is composed of or has a material or materials of particular thicknesses which singularly or in combination create optimum optical properties, or if the substrate does not produce X-Rays which are similar to the X-Rays produced by the particle of interest deposited on the substrate, the decoration layer may be of the same or of a different material from the substrate material to aid in the detection of particles. For instance, if an aluminum particle is to be detected, a bare Si wafer may be used and a carbon film may be deposited to highlight the aluminum particle. In this example, the energy of the X-Ray generated by the Si wafer may be one value, the energy of the X-Ray generated by the carbon film may be a second value, and the energy of the X-Ray generated by the aluminum particle may be a third value. In such examples, depositing film having a relatively high refractive index may serve to further highlight defects on substrates due to contrasts between the underlying substrate material, the decoration layer, and the defect particle, similar to how shining certain color light on a white background may highlight blemishes of a certain color.

In certain implementations, there may be combinations of material type, material smoothness, and material thickness that may improve or optimize the particle detection and classification probability. An example of such material types may include $SiO_2$, TiN, amorphous carbon, or other materials that will produce X-Rays that reduce background noise among the materials, i.e., the material or materials do not produce X-Rays with energies that are the same as or similar to the X-Ray energies of the particles of interest.

In such implementations, the material of the decoration layer may be selected by taking into account the composition of the underlying substrate and/or the material of the defect that is desired to be detected. In certain other implementations, the material of the decoration layer may be selected to aid in the identification of the material composition of the defects as well as or in addition to, aid in the detection of defects.

In certain implementations, the wettability of different defect particles may vary. Wettability is the tendency for decoration material to adhere to a particle. Wettability may vary due to, for example, the composition of the particle, the composition of the substrate, the composition of the decoration material, and the thickness of the decoration layer.

Figure 5:
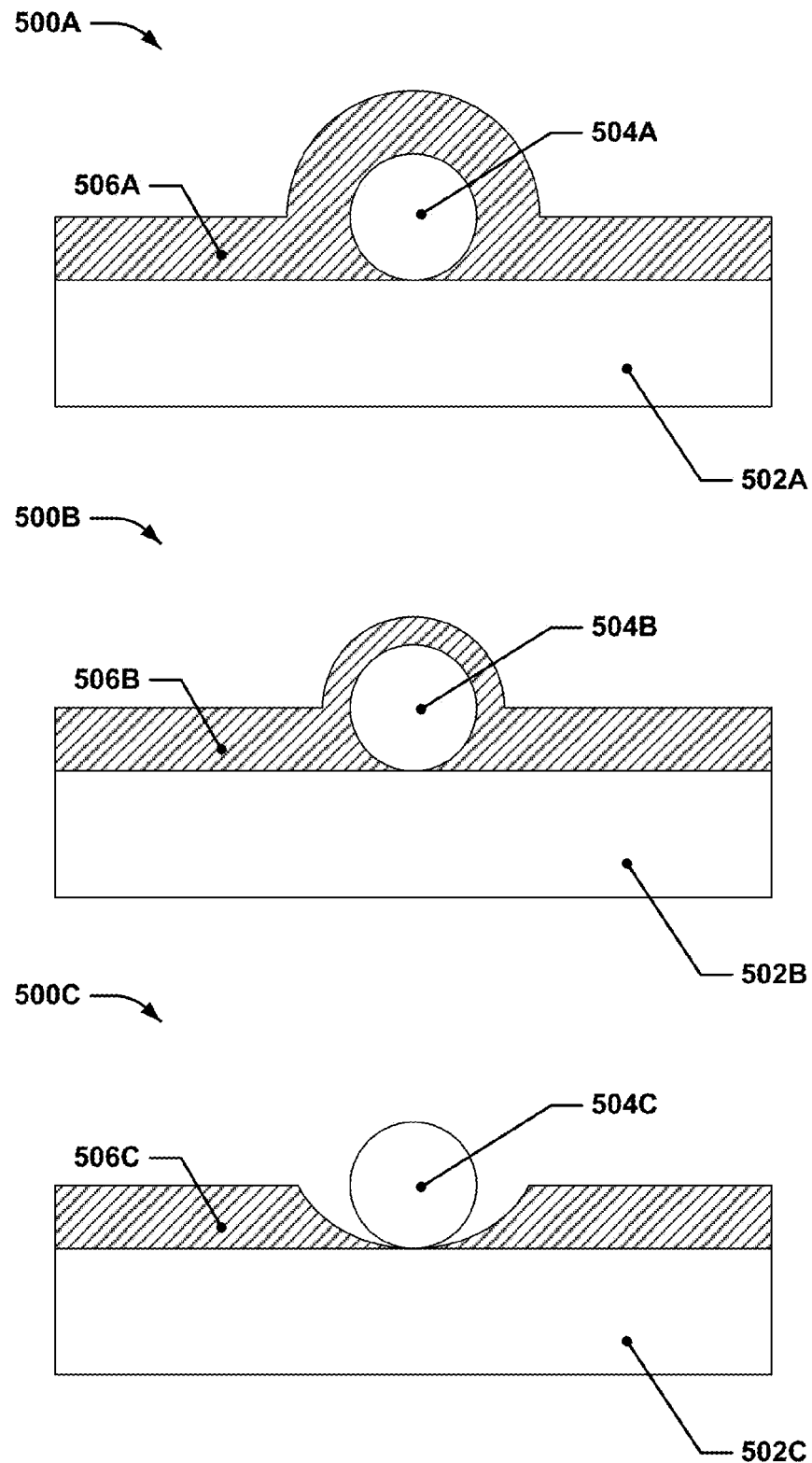
FIG. 5 shows differences in wettability between example defect particles, substrates, and decoration materials.

FIG. 5 shows differences in wettability between example defect particles, substrates, and decoration materials. FIG. 5 shows example scenarios 500A, 500B, and 500C.

Example scenario 500A demonstrates when the wettability of a defect particle is equal to that of the substrate. In scenario 500A, the thickness of decoration layer 506A over defect particle 504A is the same thickness as the thickness of decoration layer 506A over substrate 502A.

Example scenario 500B demonstrates when the wettability of a defect particle is less than that of the substrate. In scenario 500B, the thickness of decoration layer 506B over defect particle 504B is less than the thickness of decoration layer 506B over substrate 502B.

Example scenario 500C demonstrates negative wettability of a defect particle. In scenario 500C, decoration layer 506C, when deposited, forms a crater around defect particle 504C. That is, the material of the decoration layer has a tendency to avoid the defect particle or at least does not adhere to the defect particle. Accordingly, decoration does not increase the size of the defect particle. However, the crater around the defect does increase the size of the defect relative to the surface area of the substrate.

Depending on the application, the relationship of wettability between the decoration layer, the defect particle, and the substrate may be tuned to increase the likelihood of detecting or identifying a defect. For example, if purely increasing the size of the defect is desired, the relationship between the decoration layer, defect particle, and substrate may be tuned for maximum wettability to best increase the size of the defect via decoration. Note that in certain implementation, maximum wettability may be a situation where the defect particle attracts the decoration layer more than the substrate. In such applications, the defect may actually gain a decoration layer at a quicker rate than the substrate. In other applications, a lower wettability may be desired. Such applications may call for wettability similar to that outlined in scenario 500B. Such applications may be applications where too quick of the decoration layer over the defect particle may make identification of the composition of the defect particle more difficult. In yet other applications, negative wettability, such as illustrated by scenario 500C, may be desired, perhaps to aid in the identification of the defect particle.

Figure 6:
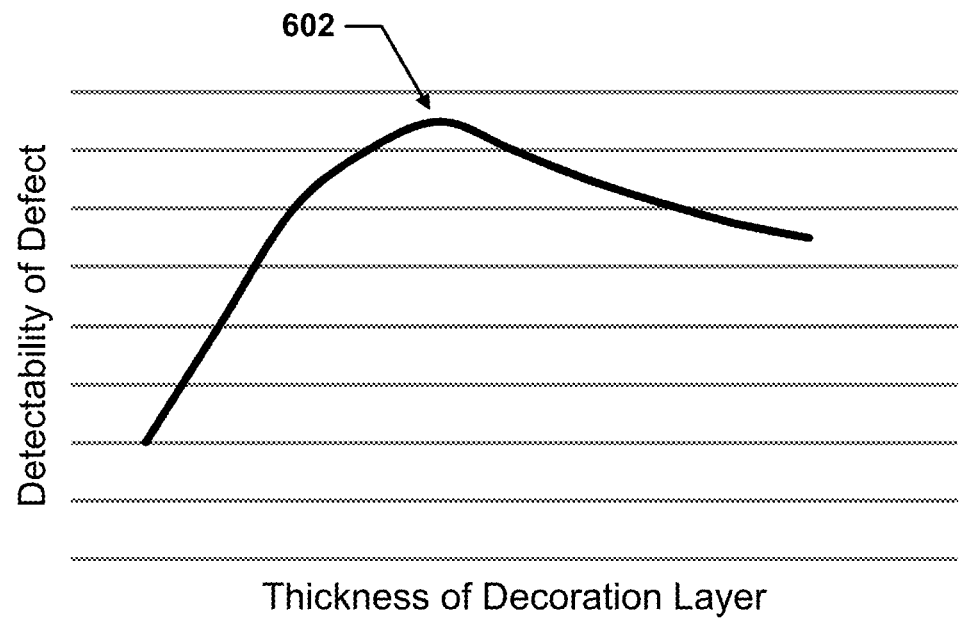
FIG. 6 is a chart showing example changes in detectability due to decoration layer thickness.

Additionally, the thickness of the decoration layer may affect the detectability of the defects. FIG. 6 is a chart showing example changes in detectability due to decoration layer thickness.

In FIG. 6, the y-axis shows the detectability of a defect, with the detectability of the defect being higher the closer it is to the top of the chart. The x-axis shows the thickness of the decoration layer, with the decoration layer being thicker the closer it is to the right of the chart. As illustrated by FIG. 6, initially, decoration improves the detectability of a defect. At point 602 though, the detectability of the defect is at a maximum. Past point 602, the detectability of the defect decreases even though additional decoration layers or a thicker decoration layer may be applied to the substrate. Accordingly, careful tuning of the thickness of the decoration layer may result in a higher likelihood of detecting defects. In certain implementations, film thicknesses of 75-100% of the size of the smallest target particles may result in best results for the detection of the defects. For example, if the target particle to be detected is a 15 nm SiO2 particle, the substrate may be decorated with a coating of TiO2, SiN, or SiO2. The TiO2 coating may be between 12-17 nm thick to optimize detection. Decoration layers thinner or thicker than 12-17 nm may lead to less SiO2 particles detected. Additionally, SiN or SiO2 coatings of the SiO2 particle may be between 15-20 nm thick and 10-15 nm thick, respectively, to optimize detection.

In certain implementations, there may a thickness or a range of thicknesses that may improve or optimize particle detection and classification. The optimal film thickness may be related to the wavelength of the laser that is used in detection equipment as well as the size of the particle. Thickness selected may produce either an antireflective (destructive interference) or reflective (constructive interference) condition at the laser wavelength and particular impingement angle of the equipment used.

It is to be appreciated that FIG. 6 is a demonstrative example of an example implementation of decoration. Other implementations of decoration may have different relationships between decoration layer thickness and defect detectability.

Figure 7A:
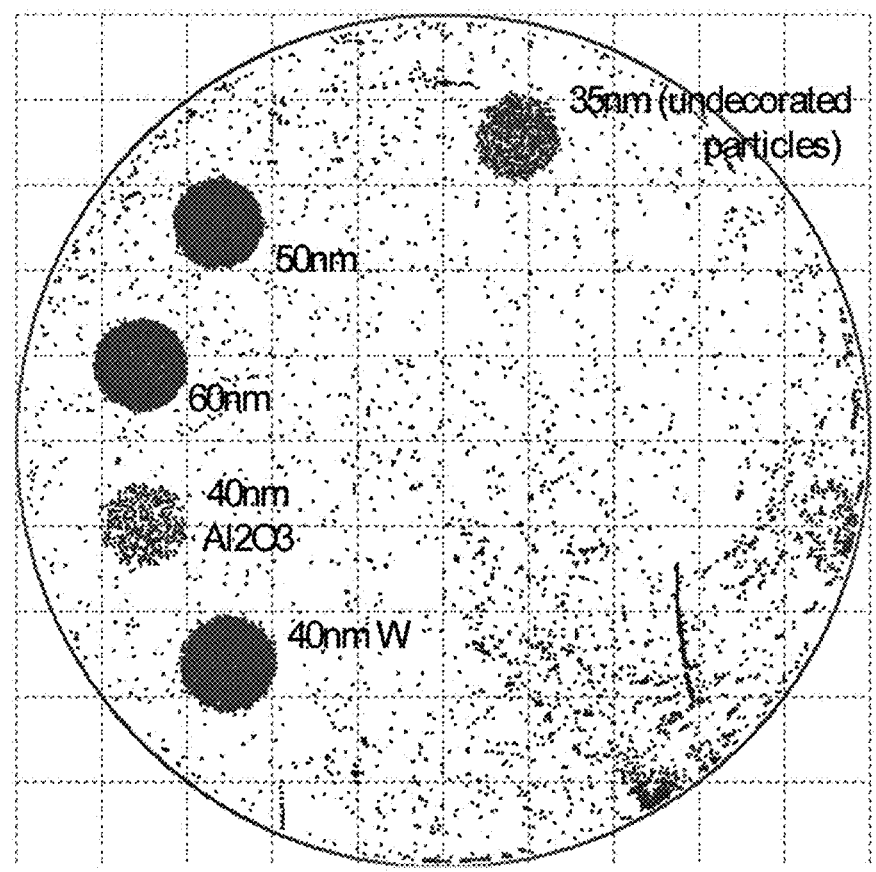
FIG. 7A shows defects detected on a test substrate with defects of various sizes

FIG. 7A shows defects detected on a test substrate with defects of various sizes. The defects of FIG. 7A may be detected with a defect detecting apparatus such as laser metrology equipment during a defect detection procedure. The substrate of FIG. 7A has not undergone defect decoration and so the defects are their original size.

The substrate shown in FIG. 7A include $SiO_2$ defects of 60 nm, 50 nm, 40 nm, 35 nm, 32 nm, and 30 nm diameter as well as $Al_2O_3$ and W defects of 40 nm diameter. The 35 nm diameter defects of $SiO_2$ include both double particles as well as single particles. Double particles are unintended artifacts of the results.

In FIG. 7A, the defect detecting apparatus is able to detect the 40 nm W, 60 nm SiO2, 50 nm SiO2, and 35 nm SiO2 double particle defects. The defect detecting apparatus was also able to partially detect the 40 nm Al2O3 defects. The defect detecting apparatus is unable to detect the 40 nm, 35 nm single particle, 32 nm, and 30 nm SiO2 defects. Accordingly, the implementation shown in FIG. 7A has a defect detection threshold higher than 40 nm in diameter for SiO2 defects. FIG. 7A also shows that the defect detection threshold may vary depending on the composition of the defect particle.

Figure 7B:
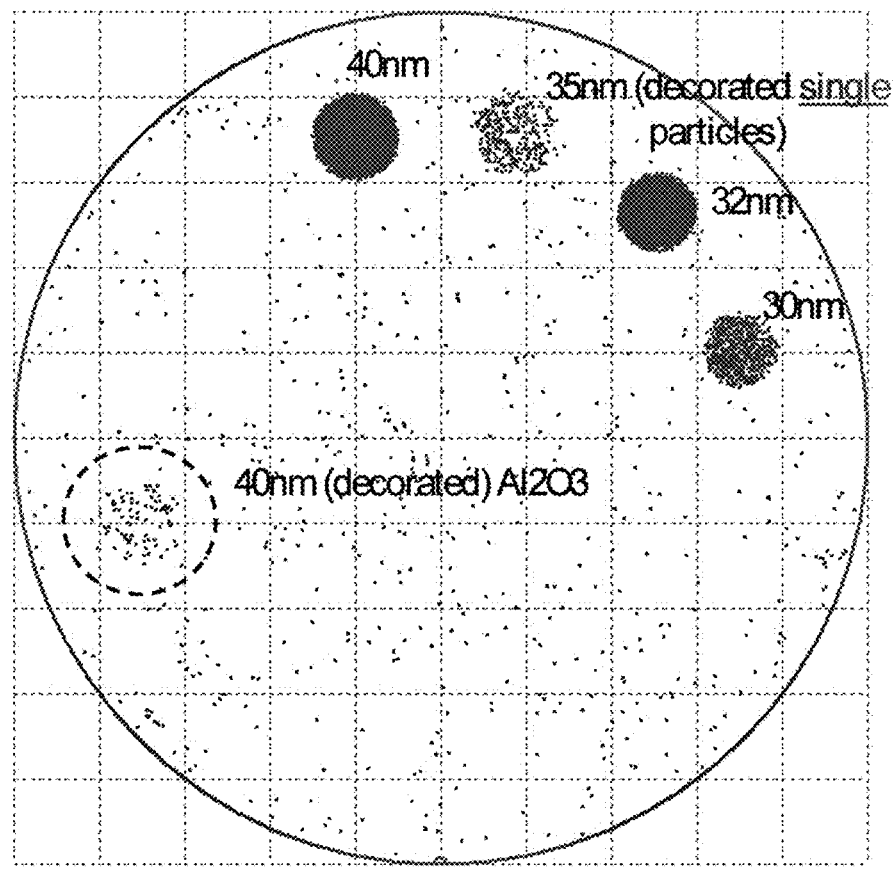
FIG. 7B shows additional defects on the test substrate in FIG. 7A that were detected after precision decoration coating was applied.

FIG. 7B shows additional defects on the test substrate in FIG. 7A that were detected after precision decoration coating was applied. FIG. 7B shows the same substrate as shown in FIG. 7A, but after decoration of the substrate. FIG. 7B shows the defects additional to the defects detected in FIG. 7A that were detected by the defect detecting apparatus after the substrate has been decorated.

FIG. 7B shows that after decoration of the substrate, the 40 nm, 35 nm single particle, 32 nm diameter $SiO_2$ defects were able to be detected by the defect detecting apparatus. The defect detecting apparatus was also able to partially detect the 30 nm diameter $SiO_2$ defects and detect additional 40 nm $Al_2O_3$ defects. Accordingly, decoration of the substrate resulted in previously undetectable defects becoming detectable.

Figure 8:
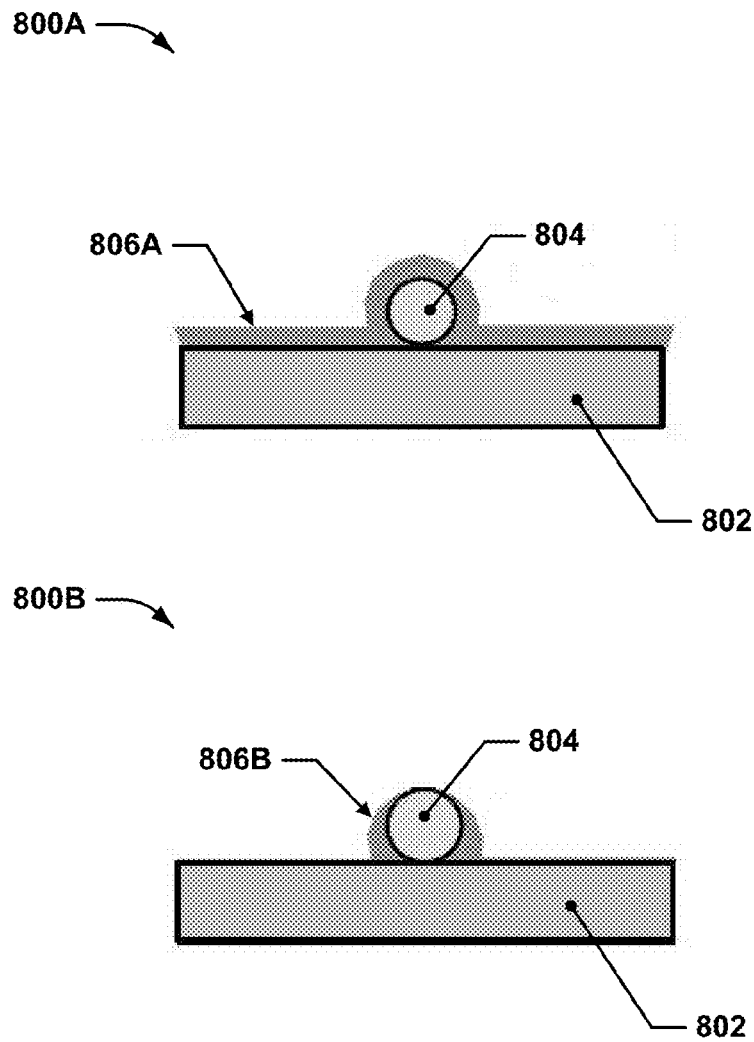
FIG. 8 illustrates an example mill back procedure that may aid in defect identification.

FIG. 8 illustrates an example mill back procedure that may aid in defect identification. Defect identification is identifying the composition of a defect particle. Step 800A shows a substrate 802 with a defect particle 804 that has been decorated with a decoration layer 800A. Step 800A shows a substrate, defect particle, and decoration layer that is similar to that shown in Step 400B of FIG. 4.

Step 800B shows the decoration layer after it has been milled back. The mill back may be accomplished with ion milling procedures or through etching procedures such as ALE or RIE. Techniques that are anisotropic, so that only the top of the decorated defect is removed, revealing just enough of the defect for identification with a surface sensitive technique such as Auger Electron Spectroscopy, may be used in certain implementations. The mill back procedure may be used when the decoration layer renders the identity of the defect particle 804 to be unidentifiable when coated with the decoration layer. In such situations, decoration may be performed on the substrate to aid in the detection of the defects. After the defects have been detected, the decoration layer may then be milled back to allow for the identification of the composition of the defects. In certain implementations, the mill back procedure may be performed before identification of the defect. In other implementations, the mill back procedure may be performed during or after identification of the defect. In certain implementations, mill back may be performed via an Auger Spectrometer which may include an electron beam generator, an Auger electron energy analyzer, and an Argon ion beam for cleaning and/or sputtering the surfaces that are to be analyzed. Such equipment may be capable of identifying the composition of the defect in addition to performing mill back.

While certain implementations may mill back all or substantially all of the decoration layer, other implementations may leave a portion of the decoration layer and only mill back the other portion of the decoration layer. The portion of the decoration layer left after mill back may be a layer that covers the substrate and the defect particles. In other implementations, all or part of the substrate and/or the defect particles may be exposed after mill back. In step 800B, a decoration layer 806B is left after mill back. After the decoration layer is milled back, the composition of the defect particle may be identified.

Figure 9:
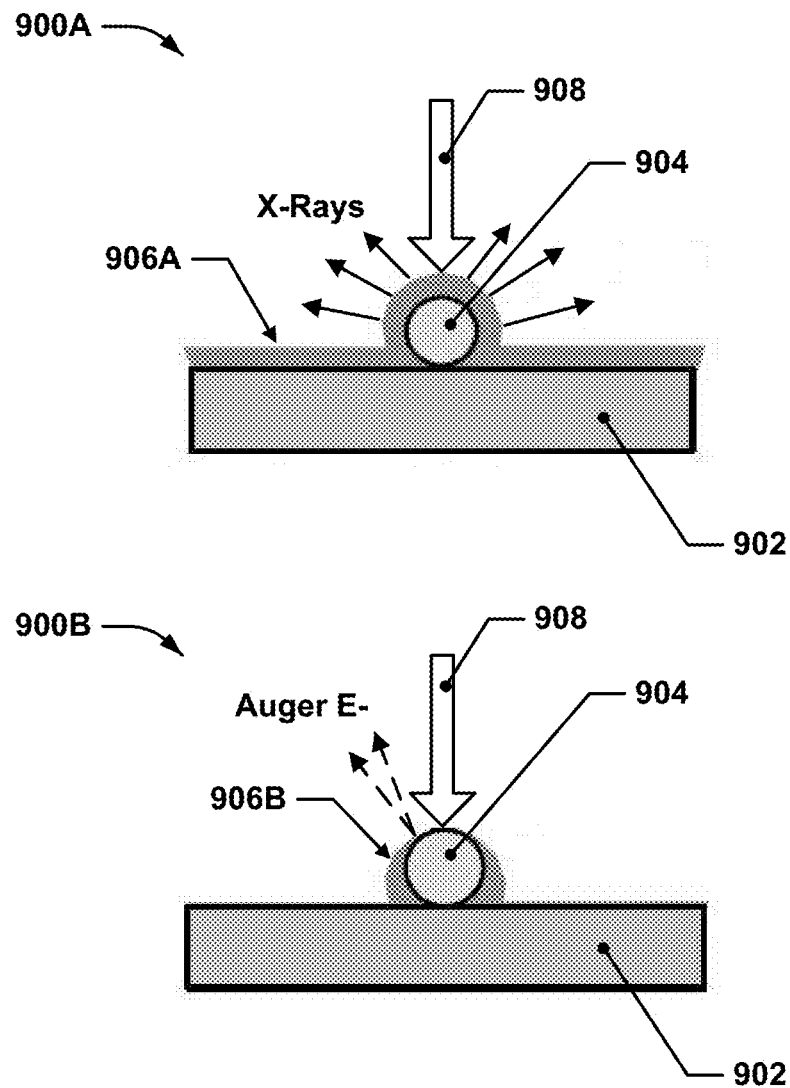
FIG. 9 illustrates example ways of identifying defect particles.

FIG. 9 illustrates example ways of identifying defect particles. In certain implementations, the apparatus may, after detecting the location of the defect, also identify the composition of the defect. In certain implementations, the composition of substrate defects may be identified by a defect detecting apparatus or a defect identifying apparatus. The defect identifying apparatus may be a part of a single station apparatus or may be part of a multi-station apparatus, as previously disclosed herein.

The defect identifying apparatus may be, for example, an electron generating apparatus such as an electron probe coupled with an electron energy analyzer/spectrometer, commonly called an Auger Spectrometer. Electrons may be generated and aimed at the substrate. Specifically, the electrons may be aimed at individual defects or groups of defects that have been detected during the defect detection procedure. The electrons may interact with the defect and the composition of the defect may be determined from the interaction of the electrons with the defect.

For example, in certain implementations as shown in FIG. 900A, the interaction of the electrons with the defect may generate X-Rays. In FIG. 900A, the defect has been decorated, but electrons 908 is still able to interact with the defect. The interaction of the electrons 908 with defect particle 904 produces X-Rays through electron-photon fluorescence, as illustrated in the figure. The X-Rays may then be detected using either or both of: energy dispersive or wavelength dispersive detectors. The composition of the defect may be determined from the characteristic energies of the detected X-Rays, where specific energies are associated with specific elements. In certain implementations, the composition of the defect is determined by matching the energy of the X-Rays produced by the electron particle interaction to X-Ray energy values produced by known or possible constituent elements.

In another example, the implementation in FIG. 900B shows probe beam electrons interacting with a substrate that has undergone a mill back operation. The mill back operation has partially exposed the defect particle 904. The probe beam electrons 908 may interact with the exposed defect particle 904 to generate Auger electrons which can escape from the particle because the coating layer has been removed. The Auger electrons may be collected and the composition of the defect particle may then be determined by analyzing their characteristic energies. In certain implementations, the composition of the defect may be determined by analyzing the energy of the Auger electrons. Other implementations may analyze a quantity of Auger electrons generated.

The implementation shown in FIG. 900B, utilizing mill back and identifying the defect particle with Auger electrons, may be used in applications where the decoration layer prevents the identity of the defect particle from being determined with X-Rays generated by the interaction of electrons with the defect particle.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A method comprising:
   (a) depositing a layer of material onto a substrate containing a plurality of particles, wherein the layer of material is deposited on at least a portion of a particle of the plurality of particles;
   (b) detecting, with metrology equipment comprising a laser, a location of the particle on the substrate on which the layer of material has been deposited; and
   (c) identifying, through the layer of material deposited on the particle, a composition of the particle.

2. The method of claim 1, further comprising (d) removing, after (c), at least a portion of the material deposited on the particle.

3. The method of claim 2, wherein the at least a portion of the material in (d) is removed via Atomic Layer Etching (ALE), reactive ion etching, or ion milling.

4. The method of claim 1, wherein (c) comprises identifying the composition of the particle via X-Rays from electrons interacting with the particle.

5. The method of claim 1, wherein the layer of material is deposited around the particles.

6. The method of claim 1, further comprising determining a thickness of the layer of material to deposit, wherein the thickness is calculated to maximize a probability of detecting the particle with the metrology equipment.

7. The method of claim 6, wherein the thickness is calculated by determining a thickness sweet spot that maximizes the probability of detecting the particle.

8. The method of claim 1, wherein a composition of one or more of the layer of material or the substrate is selected to optimize a probability of detecting the particle with the metrology equipment in (b).

9. The method of claim 1, wherein a composition of one or more of the layer of material or the substrate is selected to optimize a probability of identifying the composition of the particle in (c).

10. The method of claim 1, wherein the particle is a size that is undetectable with the metrology equipment without the deposition of the material.

11. The method of claim 1, wherein the deposition in (a) is performed via Atomic Layer Deposition (ALD).

12. The method of claim 1, performed at an ambient temperature of 200 degrees Celsius or less.

* * * * *